United States Patent [19]

Becker et al.

[11] Patent Number: 4,733,073

[45] Date of Patent: Mar. 22, 1988

[54] METHOD AND APPARATUS FOR SURFACE DIAGNOSTICS

[75] Inventors: Christopher H. Becker, Menlo Park; Keith T. Gillen; Sidney E. Buttrill, Jr., both of Palo Alto, all of Calif.

[73] Assignee: SRI International, Menlo Park, Calif.

[21] Appl. No.: 865,580

[22] Filed: May 16, 1986

Related U.S. Application Data

[63] Continuation of Ser. No. 564,949, Dec. 23, 1983, abandoned.

[51] Int. Cl.$^4$ .............................................. H01J 49/10
[52] U.S. Cl. .................................. 250/288; 250/281; 250/282; 250/287; 250/423 P
[58] Field of Search ............ 250/282, 287, 288, 423 P, 250/281

[56] References Cited

U.S. PATENT DOCUMENTS 3,660,655  5/1972  Wardell ............................... 250/282
3,727,047  4/1973  Janes ................................ 250/287 X

OTHER PUBLICATIONS

Honig, SIMS V, ed. Benninghoven et al., 1986, pp. 2–15.
Borman, Analytical Chemistry, vol. 56, No. 12, 1984, pp. 1272A–1276A.
Reuter, SIMS V, eds. Benninghoven et al., 1986, pp. 94–102.
Zare, Science, vol. 226, No. 4672, 1984, pp. 298–303.
"Fall Meeting Sampling", Materials Research Society Bulletin, vol. IX, No. 6, pp. 10–11.
Gnaser et al., Applied Physics A, vol. 37, 1985, pp. 211–220.
Becker, Scanning Electron Microscopy, 1986, vol. 4, pp. 1267–1276.
Grasserbauer, Trends in Analytical Chemistry, vol. 5, No. 5, 1986; pp. VII–IX.
Helms, Materials Research Society Symposium Proceedings, vol. 69, 1986; pp. 3–14.
Ganschow, SIMS V, eds. Benninghoven et al., 1986, pp. 79–84.
Muller et al., Journal of Vacuum Science and Technology A, vol. 3, No. 3, 1985, pp. 1367–1370.
Honig et al., Applied Physics Letters, vol. 2, No. 7, 1963, pp. 138–139.
Honig, Journal of Applied Physics, vol. 29, No. 3, 1958, pp. 549–555.
Tozer, "Theory of the Ionization of Gases by Laser Beams", Physical Review, vol. 137, No. 6A, Mar. 15, 1965, pp. A1665–A1667.

Primary Examiner—Craig E. Church
Assistant Examiner—Jack I. Berman
Attorney, Agent, or Firm—Townsend & Townsend

[57] ABSTRACT

Method and apparatus for mass spectral analysis of unknown species of matter present on a surface even in extremely low concentrations. A probe beam such as an ion beam, electron beam or laser is directed to the surface under examination to remove a sample of material. An untuned, high-intensity laser is directed to a spatial region proximate to the surface. The laser has sufficient intensity to induce a high degree of nonresonant, and hence non-selective, photoionization of the sample of material within the laser beam. The non-selectively ionized sample is then subjected to mass spectral analysis to determine the nature of the unknown species.

36 Claims, 3 Drawing Figures

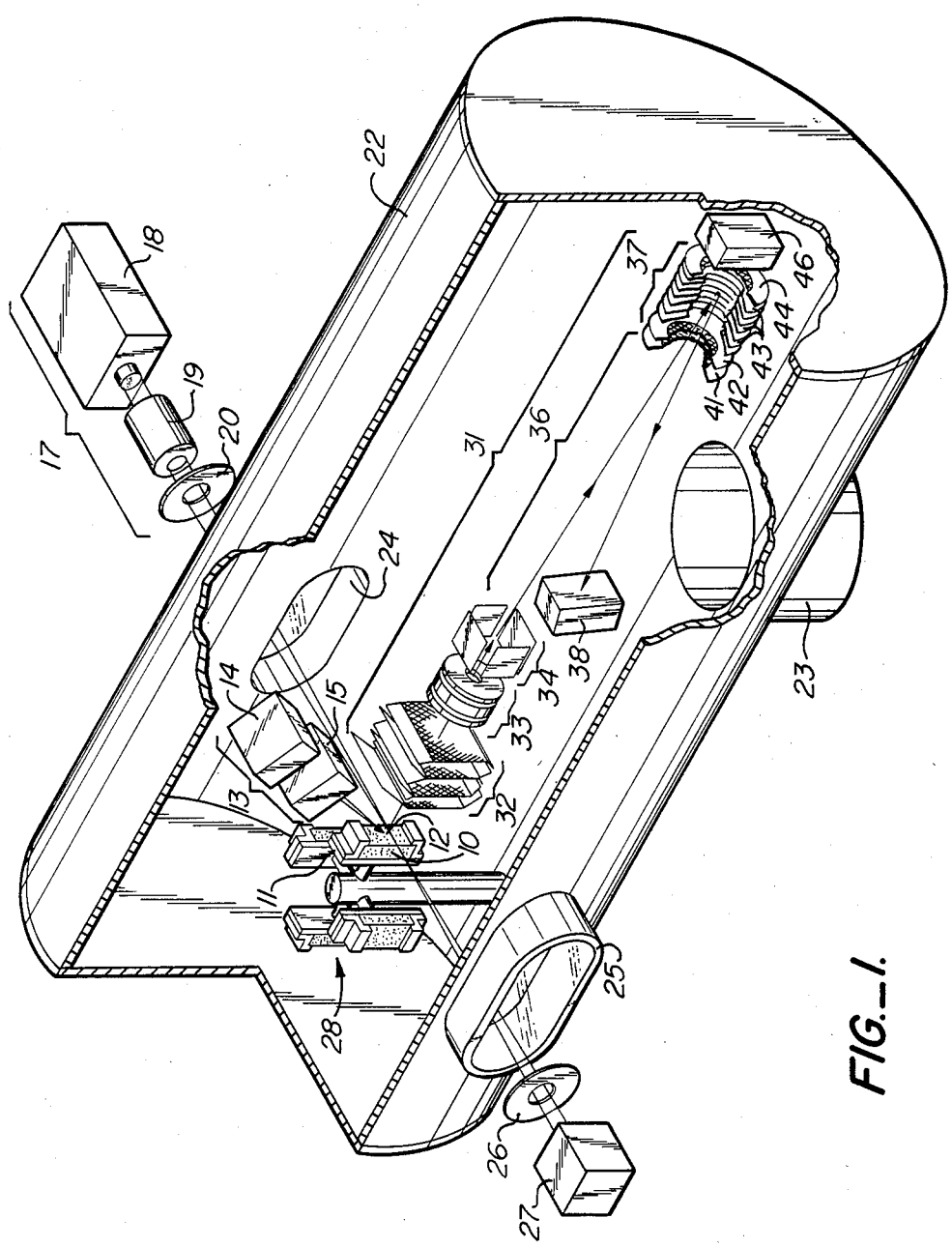
FIG._1.

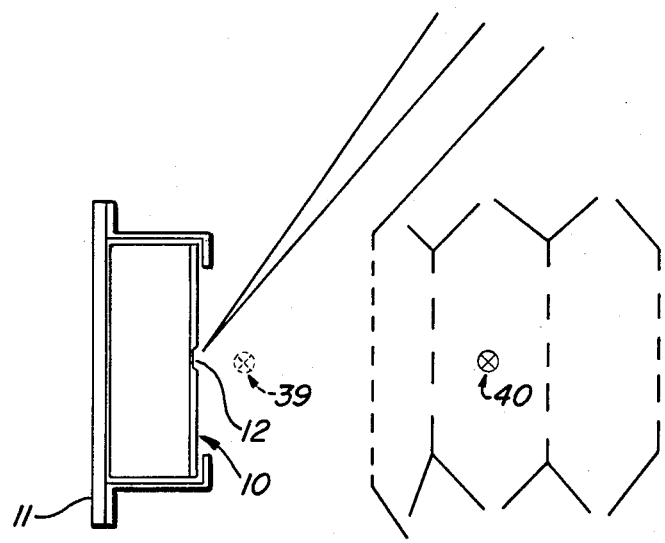
FIG._2.
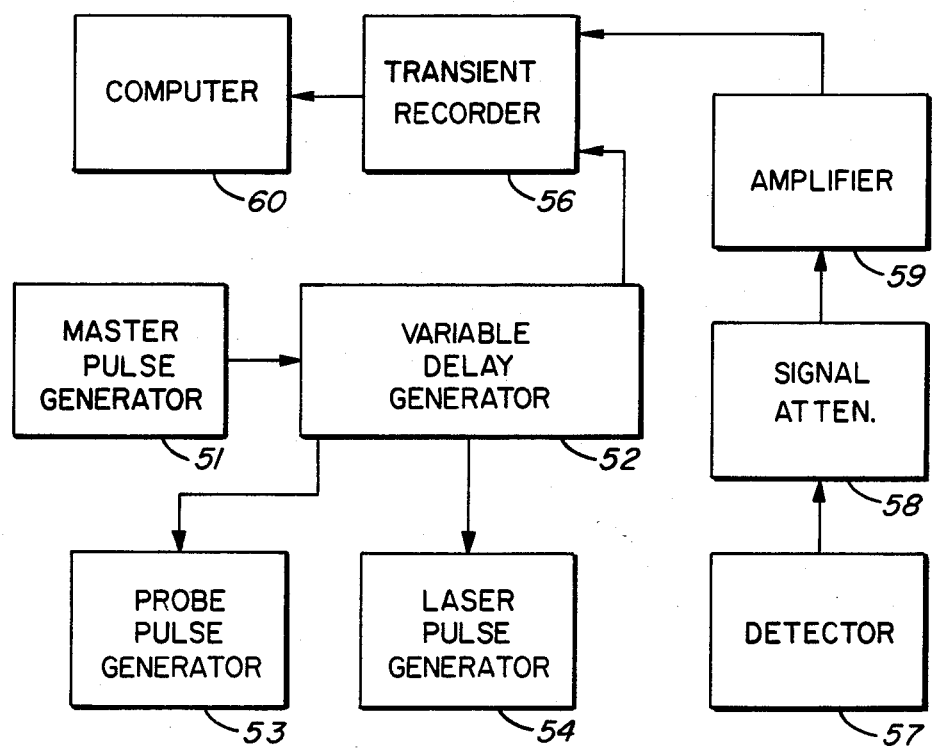
FIG._3.

METHOD AND APPARATUS FOR SURFACE DIAGNOSTICS

This is a continuation of Ser. No. 564,949, filed Dec. 23, 1983, now abandoned.

BACKGROUND OF THE INVENTION

The invention relates to techniques for local analysis of surfaces; more particularly, it is directed to techniques for mass spectral analysis of species of matter on, or forming a part of, a surface.

In surface analysis by mass spectroscopic techniques the specimen to be examined is placed in a high-vacuum chamber and bombarded by a probe beam of one kind or another. The probe beam removes a sample of matter from the surface, at least a portion of which is ionized in the process of removal or subsequent thereto. The ionized sample is then subjected to mass spectral analysis.

Examples of known techniques for surface mass spectral analysis include laser microprobe methods and secondary ion mass spectrometry. Both of these methods contain undesirable limitations. Laser microprobe mass spectrometry, for example, uses a focused high-intensity laser to irradiate a surface directly and blow off large amounts of material, only a small fraction of which is ionized as it departs from the surface. The high-intensity laser results in highly destructive sampling of the surface; the intense laser pulse used in typical instruments forms craters of 0.1 to 1.0 micrometers in depth and is therefore not truly surface-sensitive. The laser microprobe technique is also difficult to model because ionization efficiencies depend sensitively on the various collisional processes occurring in the laser-generated plasma at the surface.

In secondary ion mass spectrometry (SIMS) the surface under examination is bombarded with an ion beam or fast neutral beam, which sputters a sample of ionized and neutral matter from the surface. In general, quantitative analytical information is difficult to derive from the SIMS method because the physical processes that determine the ionization probability of the sputtered matter are not, as a rule, well understood and because ionization probabilities depend sensitively on surface composition (so-called matrix effects) and cleanliness (so-called chemical enhancement effects). As a practical matter, quantitative analytical information can be extracted from the SIMS method only by using especially prepared standards for comparison.

In many of the commonly practiced techniques, such as the laser microprobe or SIMS methods, only a small portion of the sample removed from the surface is ionized. One attempt to provide a highly ionized sample is disclosed in U.S. Pat. No. 4,001,582 in the name of Castaing, et al. In the Castaing method, particles sputtered from the surface are introduced into a chamber at high temperatures and are subjected to successive adsorptions and desorptions on the walls of the chamber. This process efficiently ionizes atoms of suitably low ionization potential with a high probability. However, molecules (as opposed to atoms) are generally dissociated in the hot ionizing chamber, so that the Castaing method yields information only on atomic species. Additionally, many atoms have ionization potentials too large to be ionized and detected by this method. Contamination and material degradation problems can also be severe in the extreme environment of the high temperature detector.

Another approach presenting enhanced ionization efficiency is disclosed by N. Winograd, J. P. Baxter and F. M. Kimock, *Chemical Physics Letters*, Vol. 88, No. 6, 1982 pp. 581-84. In this approach a laser is directed to a sample of neutral atoms, which have been sputtered from the surface under examination. The laser is tuned to a predetermined wavelength corresponding to an excited state of a preselected atom of interest known or expected to be present in the sample. The laser has sufficient intensity to induce resonance multiphoton ionization of the preselected atom. This method has the obvious drawback that it is necessary to tune the laser to a predetermined wavelength. Thus, the method is applicable only to certain species of matter which have known excitation spectra with excitation wavelengths accessible to the available laser and which are already known or strongly suspected to be present on the surface.

SUMMARY OF THE INVENTION

The present invention provides an extremely reliable and versatile method and apparatus for detecting and distinguishing unknown species of matter at extremely low surface concentrations. It has been discovered that the process of non-resonant photoionization may be utilized to make a practical instrument capable of highly sensitive surface diagnostics and free of the restrictions imposed by the above-mentioned methods.

Briefly, under high vacuum a probe beam such as an ion beam, electron beam, or laser beam is directed to the surface under examination to cause a sample of material to be removed from the surface. A beam of electromagnetic radiation, which may be provided by an untuned, high-intensity laser, is then directed to a spatial region proximate to the surface causing non-resonant ionization of the removed surface sample within the beam of radiation. It has been discovered that within the practical limits of readily achievable laser intensities this beam may be given sufficient intensity to induce a high degree of non-resonant, and hence non-selective, photoionization of the sample. The ionized sample is then subjected to mass spectral analysis to determine the nature of the species included therein.

Apparatus according to the invention for practicing the above method includes an evacuation chamber, in which is disposed a means for mounting the specimen under examination. A probe beam means is provided for directing a probe beam at the surface of the specimen so as to cause a sample to be ejected into the evacuation chamber. Ionizing beam means provides a non-resonant ionizing beam of radiation which is directed at a spatial region (referred to as the ionization region) above the surface. The ionizing beam has an intensity sufficient to induce non-resonant photoionization of the sample found in the ionizing region. Means is provided within the evacuation chamber for accelerating the ionized sample into a region including means for mass analysis of the ions. A preferred mass analysis means compatible with pulsed laser ionization provides an ion drift region, so as to enable time-of-flight analysis of the ionized sample. For greater mass resolution a preferred embodiment of the apparatus includes ion reflector means disposed within the drift region for effectively compensating for undesirable spreading of the arrival times caused by the initial ion velocity distributions. Detection means is disposed within the evacuation chamber for detecting the ions emerging from the drift region.

The invention provides a number of advantages which have not previously been found in a single instrument. The method and apparatus according to the invention are not restricted to the investigation of atomic species or simple molecular species having known excitation and ionization spectra. The invention may be applied to a wide variety of compounds of interest including contaminated or doped substrates, adsorbed or reacted overlayers, or even biological samples which have been precipitated onto or otherwise applied to a surface. All masses can be investigated simultaneously with a single (untuned) laser wavelength. Every atom is accessible to ionization by the present technique.

The probe beam intensity may be adjusted so as to produce minimal damage to the surface under examination. Notwithstanding the reduced probe beam intensity, the nonresonant ionizing beam produces sufficient ionization of the sample that even extremely low concentrations of matter can be detected.

The method and apparatus of the invention are sufficiently reliable and accurate, and sufficiently nondestructive in the surface-removal step, that it is possible to monitor changes in concentrations of species in the course of chemical reactions taking place on the surface.

A further understanding and appreciation of the nature and advantages of the invention may be gained by reference to the remaining portion of the specification and to the attached drawings.

BRIEF DESCRIPTION OF THE DRAWINGS

FIG. 1 is a perspective view of apparatus according to the invention;

FIG. 2 is an elevational view of a detail from FIG. 1 showing two alternative ionizing regions; and FIG. 3 is a block schematic diagram of an electronic circuit for use with the apparatus of FIG. 1.

DETAILED DESCRIPTION OF THE PREFERRED EMBODIMENT

The nonresonant photoionization method of the present invention requires a probe beam for removing a sample of material from the surface under examination and a separate high-intensity nonresonant ionizing beam of radiation. As the term "nonresonant ionizing beam of radiation" is used herein, it means a beam of electromagnetic radiation which has not been tuned to a predetermined wavelength associated with the specimen under examination. The great advantage to be derived from a high-intensity nonresonant ionizing beam, which has not been achieved by photoionization methods employed in the past, is that efficient ionization is achievable without the necessity of knowing in advance the nature of the species of matter under examination. Therefore, it is also not necessary to know the excitation spectra of the various components of the species under examination.

The probe beam for removing the sample from the surface may be provided, for example, by an electron beam, an ion beam, a fast atom beam, or a laser beam. The separation of the sample-removal step from the ionization step allows independent control of the sample-removal and ionization processes. Thus the probe beam can be directed to a localized region of the surface and adjusted in intensity so as to scan the depth from which the sample is removed (so-called depth profiling) or to scan the surface area over which the sample is removed (so-called microscopy). In this manner monolayers of particles adsorbed on the surface may be sampled from extremely localized regions.

Ionization of the sample under examination may occur through single-photon and multi-photon processes. Ionization occurs by means of a multi-photon mechanism at a lower photon energy than by means of a single-photon mechanism, but the multi-photon approach requires higher overall intensities. In fact, it has generally been believed that a resonance condition is required in the multi-photon approach to achieve sufficient ionization for subsequent mass spectral analysis. In the present invention it has been discovered that ionization of the sample removed from the surface can be saturated in the ionizing region with nonresonant multi-photon photoionization. This discovery has eliminated the serious drawbacks of the resonance multi-photon ionization method: namely, the need to know the components of the species of matter under examination in advance; the need to know their excitation spectra so that the laser may be tuned to each predetermined multi-photon resonance; and the resultant limitation of detecting only one mass-to-charge ratio at a time. Although a laser with sufficient intensity to induce nonresonant multi-photon ionization may also coincidentally produce an occasional resonant ionization of some species present in the sample, the knowledge of the existence of such species is not necessary beforehand. The possibility of such incidental resonant excitations has not been found to interfere with the nonresonant photoionization of the bulk of the sample, nor has the presence of an occasional resonant excitation been found to detract from the advantages derived from nonresonant photoionization.

The ionizing beam for nonresonant multi-photon ionization may be provided by a laser having a power density in the range of $10^6$ to $10^{12}$ W/cm$^2$. The laser is advantageously pulsed for time-of-flight mass spectrometry, the pulses having a period of about $10^{-8}$ seconds. For nonresonant single-photon ionization less light intensity is needed; generally though, pulses with at least about $10^{12}$ photons per pulse are needed for efficient ionization.

By way of example, a mass spectrum was derived from a sputter-cleaned surface of an NBS standard copper specimen of known bulk composition. With a pulsed 3-keV Ar$^+$ ion probe beam hitting the surface over an area of about 0.1 cm$^2$ and a 10 pulse/sec, 20 millijoule/pulse KrF (248 nm) laser ionizing beam focused by a 40 cm focal length lens to a spot 1 mm above the specimen surface, impurity isotopes at concentrations from 1 to 10 ppm (parts per million) were easily observed in an experiment that removed a total of about $10^{-10}$ g, equivalent to 0.01 monolayer, from the copper sample. In this experiment the detector was estimated to collect one ion for every $10^4$–$10^5$ surface atoms removed by the probe beam. These results are cited by way of example only, and it should be readily appreciated by those skilled in the art that conventional techniques can be used to obtain a larger collection solid angle in the ionization zone both through better focusing of the ion beam onto the surface, allowing smaller distances from the ionization zone to the surface, and through larger ionization zones derived from more intense pulsed lasers or larger laser beam focal waists. Impurity measurements well below the level of 1 ppm should be readily accessible.

In this copper sample, sputtered neutral dimers are also observed as dimer ions after photoionization by the laser. These include, of course, $Cu_2$ but also CuAg even though each of the two isotopes of Ag is only approximately 50 ppm of the Cu sample. For various metal samples doubly charged ions, e.g. $Pt^{++}$, $W^{++}$, $Ta^{++}$, $Cu^{++}$, have also been observed, which indicates strongly saturated conditions for the singly ionized entities. In another example, hydrocarbon molecules adsorbed on catalytically active metal surfaces have been observed.

Apparatus for practicing the above method will now be described with reference to the overall view shown in FIG. 1 and the detail of FIG. 2. The specimen of interest 10 is mounted in fixed position by specimen holder 11, which exposes the surface 12 under examination. Probe beam means 13 provides a probe beam which is directed to a localized area of the surface 12. The probe beam means 13 is illustrated schematically in FIG. 1. It will generally include a beam source 14 and means 15 for directing the probe beam generated by source 14 onto the localized area of the surface 12 under examination.

Beam source 14 may be provided, for example, by an electron gun or ion gun or by a laser. The construction of such beam sources is conventional and is well known to those skilled in the art, for example, from electron beam desorption, ion beam sputtering, or laser microprobe techniques. When the probe beam is a charged particle beam, means 15 for directing the beam onto the surface 12 may be provided by an assembly comprising an electrostatic or magnetic lens and horizontal and vertical electrostatic deflection plates. When a laser provides the probe beam, means 15 will generally be provided by a system of mirrors and lenses. In focusing the ion beam or laser beam onto a localized region of the surface 12, the means 15 enhances the power density of the beam at the surface, which allows a lower intensity ion beam or laser to be used for the beam source 14.

Means 17 provides an ionizing beam of radiation which is directed to a region proximate to the surface 12 so as to irradiate a substantial portion of the sample removed by the probe beam. The means 17 will generally include a high-intensity light source 18, a focusing lens system 19 and an iris 20 for use in defining the position of the ionizing beam. Beam source 18 will typically be provided by a high-intensity laser or an assembly of lasers and optical materials and components coupled together to achieve sufficiently high power for saturation of the ionization of the sample under investigation.

Generally, use of a shorter wavelength of light will permit saturation of ionization at lower light intensities than for longer wavelengths. Quantitative analysis of relative amounts of desorbed or sputtered atomic species can be achieved by measuring the signal levels at the saturation power density for ionization of each chemical species. The dependence of the mass spectrum on laser power is a useful diagnostic tool both for assessing relative degrees of ionization of different species and for evaluating the importance of dissociation processes in molecular components. For examination of molecules, especially complex entities, high laser powers may cause extensive molecular fragmentation in addition to the ionization; use of lower laser powers will often yield spectra with lower degrees of fragmentation.

The specimen under investigation is housed within an evacuation chamber 22 which is provided with pumping means, e.g., a port 23 adapted for connection to a vacuum pump (not shown). When the probe beam is provided by a laser beam, the laser is mounted outside of chamber 22, which is provided with an additional window (not shown) through which the beam enters the chamber. When probe beam source 14 is provided by an ion gun, the source 14 may be contained in an adjacent chamber evacuated by additional vacuum pumps (not shown) and connected to chamber 22 by a small aperture through which the ion beam enters.

In the embodiment of FIG. 1 evacuation chamber 22 is provided with diametrically opposed windows 24 and 25, through which the ionizing beam of radiation is projected. The ionizing beam means 17 is mounted outside evacuation chamber 22, and the ionizing beam is directed through window 24 to the ionization region proximate to the surface 12 under investigation. The ionizing beam continues through window 25, passes through position-defining iris 26, and is received by detector 27, which serves to monitor the light intensity. For convenience mounting means 28 is provided within evacuation chamber 22 for mounting a plurality of specimens. In this way several specimens may be investigated without having to break the vacuum within chamber 22. Mounting means 28 is connected to a position manipulator (not shown) and is accessible through an associated specimen introduction system (not shown).

Evacuation chamber 22 also includes mass spectrometer means, indicated generally at 31, for mass analysis of the sample ionized by the ionizing beam. The preferred embodiment utilizes a time-of-flight mass spectrometer. Other types of mass spectrometers, for example, the Mattauch-Herzog focal plane mass spectrometer, may be employed as well. As illustrated in FIGS. 1 and 2, evacuation chamber 22 includes gridded electrostatic extraction network 32, electrostatic focusing lens 33, deflection plates 34, field-free region 36, ion reflection means 37, and particle detector 38. The arrangement of FIGS. 1 and 2 provides for two alternative placements of the ionizing laser beam. When the specimen under examination has an electrically conducting surface, the beam may be directed close to the surface at the position indicated at 39 in FIG. 2. In this arrangement the electrostatic extraction network 32 is not energized. Instead, the surface of the specimen is floated at a high potential to repel the photo-ions through the network 32 and into the time-of-flight drift region 36. When the surface of the specimen under examination is not electrically conducting, the ionizing laser beam is directed between two grids of the electrostatic extraction network 32, as illustrated in FIG. 2 at 40. In this arrangement it is the network 32 which repels the photo-ions into drift region 36. Windows 24 and 25 are large enough to allow the laser beam to be directed to either of the positions 39 or 40. After extraction from the ionizing region, the photo-ions are focused by electrostatic focusing lens 33 and aligned by deflection plates 34. In an alternative embodiment, immersion lens means could be used to accelerate and direct the photo-ions.

In a typical time-of-flight mass spectrometer the ions exiting from the drift region would be received directly by a detector. In the preferred embodiment of the invention ions leaving the drift region are reflected by ion reflection means 37 and traverse the field-free drift region 36 once again to enter detector 38. The detector is a particle multiplier, for example, a microchannel plate which is apertured so that only ions coming from the direction of reflecting means 37 will be detected. As illustrated in FIG. 1, the ion reflector 37 comprises outer reflector grid 41 at ground potential, middle reflector grid 42, providing a decelerating potential, an assembly of electrostatic guard rings 43 connected by resistors to insure a uniform field in the reflector region, and a back reflector grid 44, providing a reflecting potential. The embodiment of FIG. 1 also includes an auxiliary particle detector 46 of like construction to particle detector 38 positioned to detect particles passing entirely through reflector means 37. When the ionization region is located at position 39 near the surface under examination, ions produced directly at the surface by the probe beam (the so-called secondary ions) will have a higher energy than the photo-ions produced by the ionizing laser. These ions can be separated by adjusting the relative potential of the surface of specimen 10 and the back reflecting grid 44 of reflecting means 37 so that the higher-energy secondary ions pass through the back reflector grid 44 and are detected by particle detector 46 while the lower-energy photo-ions are reflected and detected by detector 38. When the ionizing beam passes between the plates of the electrostatic extraction network 32, the secondary ions are prevented from entering spectrometer 31 by the repelling plate potential of network 32.

The use of an ion reflector in time-of-flight mass spectrometry is known in the art. The construction of such an ion reflector is disclosed, for example, by D. M. Lubman et al., *Analytical Chemistry,* Vol. 55, No. 8 (1983) pp. 1437-40 and by G. S. Janes in U.S. Pat. No. 3,727,047. The ion reflector provides for high resolution over a wide range of charge-to-mass ratios by compensating for the spread in the times at which ions would otherwise arrive at detector 38 due to their initial velocity distribution. The ion reflector is especially advantageous in the present invention to provide greater resolution of the many components which may be non-selectively ionized by the nonresonant beam. A further advantage of the ion reflector in the present invention is the ability it affords for distinguishing metastable molecular ions that dissociate along the path in drift region 36 before entering the reflector. The potential of the back reflector grid 44 can be adjusted so that the parent ions pass through while the lower-energy decay products of the metastable ions are reflected for detection by detector 38. Thus, the use of the ion reflector enables the instrument to take greater advantage of the nonresonant beam's capacity for nonselective ionization. A further advantage of the ion reflector in the present invention, which has not been appreciated in surface analysis techniques, is the discrimination between photo-ions and secondary ions described in the preceding paragraph.

In many applications of the invention it is desirable to operate the probe beam and the ionizing beam in a pulsed mode. A block schematic diagram of electronic circuitry for operation of the invention is shown in FIG. 3. Pulse generator 51 provides a master repetition-rate signal, for example, a ten Hertz signal for controlling the pulse repetition rate of the probe and/or ionizing beams. The master signal from pulse generator 51 is applied to three-channel delay generator 52. Channel 1 of delay generator 52 provides a trigger signal to probe beam pulsing means 53. The pulsing means 53 is operatively associated with the probe beam means for producing a probe beam pulse having a desired width. Channel 2 of delay generator 52 provides a trigger signal to ionizing beam pulsing means 54, which is operatively associated with the ionizing beam source to provide a desired pulse delay. Suitable pulsing means are well known to those skilled in the art from their use in other pulsed ion beam or pulsed electron beam applications and pulsed laser applications and will not be described further. Channel 3 of delay generator 52 provides a trigger signal to transient recorder 56. The trigger signal from channel 3 sets the time position for the initial channel of the transient recorder in a time-of-flight measurement. Block 57 represents the signal-generating portion of the particle detector, for example, the anode of a multichannel plate particle multiplier. The signal from block 57 is passed through a variable high-frequency response signal attenuator 58, which may be of conventional design, and is amplified by fast linear amplifier 59. The amplified signal is applied to transient recorder 56, which may be provided by a fast A/D converter. With a laser pulse width of 5-10 nanoseconds, attenuator 58 and amplifier 59 should have bandwidths greater than 150 megahertz to achieve acceptable resolution. The time-of-flight measurement data registered by transient recorder 56 are entered into computer 60 for storage and analysis. Methods of analysis of time-of-flight measurement data are well known to those skilled in the art and do not form a part of the present invention.

Signal attenuator 58 is helpful in comparing different components present in greatly differing concentrations. For a sufficiently large signal associated with a component present in high concentration, amplifier 59 will tend to saturate, which will bias the ratio of components present. Attenuator 58 reduces large signals by a known factor so as to allow the normalization of small signals to large ones.

The circuitry of FIG. 3 is presented only by way of illustration and numerous alternative arrangements could be used. For example, the trigger signal indicating the time zero for a time-of-flight measurement may alternatively be provided by a pulse suitably delayed after initiation by a pulse from a photo diode positioned to detect light from the laser beam. Start and stop pulses generated by the photo diode and by the particle detector, respectively, can be applied with suitable time delay of the start pulse to a time-to-digital converter for time-of-flight measurement in an alternative approach for examining mass ranges where the ion arrival rate is low (less than 1 ion per laser pulse).

The apparatus and method of the present invention may be utilized in a variety of surface and diagnostic applications. In addition to detecting components present in low concentrations on a surface, the invention provides sufficient resolution and is sufficiently non-destructive that it may be used to monitor chemical reactions taking place on the surface. The invention is also suited for in situ diagnostics of integrated circuit components. For example, the method described herein may be combined with standard ion milling techniques to achieve depth profiling of IC chips. With a focused probe beam the method and apparatus can also be used as a microscope to reveal the composition of topographical features. Adsorbed molecules, including radical species, can be detected in circumstances as diverse as heterogeneous catalysis, chemical agents monitoring, and analysis of biological molecules. In this regard, the ionizing laser power density may be varied over a range to examine fragmentation patterns of biological or other complex molecules. Angular distributions of atoms and molecules removed from the surface by the probe beam may be monitored by controlling the position at which the probe beam strikes the surface and its relation to the location of the ionization volume. In addition, the pulsed mode of operation may be used to monitor kinetic energy distributions of desorbing or sputtered species by varying the time delay between channel 1 and 2 of delay generator 52 in FIG. 3. In this circumstance, the velocity of a particle removed from the surface and traveling toward the ionization region will be inversely proportional to the time of flight from the localized region under examination to the ionization region. With the present invention the probe beam pulse width and the width of the ionization region may be made sufficiently small to achieve good resolution of the kinetic energy distribution.

While the above provides a full and complete disclosure of the preferred embodiments of the invention, various modifications, alternate constructions, and equivalents may be employed without departing from the true spirit and scope of the invention. Therefore, the above description and illustration should not be construed as limiting the scope of the invention, which is defined by the appended claims.

What is claimed is:

1. A method of analyzing a surface including unknown species of matter comprising the steps of:
   directing a probe beam at the surface to cause a sample of material to be removed therefrom;
   directing a non-resonant ionizing beam of radiation at the removed sample proximate the surface, said ionizing beam having an intensity sufficient to induce non-resonant photo-ionization of said sample, whereby species of matter included in said sample will be non-selectively ionized; and
   subjecting the ionized sample to mass-spectrometric analysis to determine the nature of said species.

2. The method of claim 1 wherein said ionized sample is subjected to time-of-flight mass spectrometric analysis and said analysis includes the step of time focusing said ionized sample so as to compensate for a spread in velocities of ions in said sample, thereby enhancing the resolution of said analysis.

3. The method of claim 2, further comprising the step of adjusting the intensity of said probe beam so as to remove only minute amounts of material from said surface, whereby minimal damage is done to said surface.

4. The method of claim 2 wherein said time focusing step comprises the step of electrostatically reflecting said ionized sample.

5. The method of claim 1 wherein said ionized sample is subjected to time of flight mass spectrometric analysis and said analysis includes the step of energetically discriminating against secondary ions from the surface, thereby reducing unwanted background.

6. The method of claim 5, further comprising the step of adjusting the intensity of said probe beam so as to remove only minute amounts of material from said surface, whereby minimal damage is done to said surface.

7. A method of analyzing a surface including unknown species of matter comprising the steps of:
   directing a probe beam at the surface to cause a sample of material to be removed therefrom;
   directing a non-resonant ionizing beam of radiation at the removed sample proximate the surface, said ionizing beam having an intensity sufficient to induce non-resonant multi-photon ionization of said sample, whereby species of matter included in said sample will be non-selectively ionized; and
   subjecting the ionized sample to mass-spectrometric analysis to determine the nature of said species.

8. The method of claim 2 wherein said ionized sample is subjected to time-of-flight mass spectrometric analysis and said analysis includes the step of time focusing said ionized sample so as to compensate for a spread in initial velocities of ions in said sample, thereby enhancing the resolution of said analysis.

9. The method of claim 8 further comprising the step of adjusting the intensity of said probe beam so as to remove only minute amounts of material from said surface, whereby minimal damage is done to said surface.

10. The method of claim 8 wherein said time focusing step comprises the step of electrostatically reflecting said ionized sample.

11. The method of claim 2 wherein said ionized sample is subjected to time-of-flight mass spectrometric analysis and said analysis includes the step of energetically discriminating against secondary ions from the surface, thereby reducing unwanted background.

12. The method of claim 11, further comprising the step of adjusting the intensity of said probe beam so as to remove only minute amounts of material from said surface, whereby minimal damage is done to said surface.

13. A method of analyzing a surface with comparatively little damage thereto wherein a probe beam is directed at said surface to cause a sample of material to be removed therefrom for subsequent analysis, said method comprising the steps of:
   adjusting the intensity of said probe beam so as to remove only minute amounts of material from said surface, whereby minimal damage is done to said surface;
   directing a non-resonant ionizing beam of radiation at the removed sample in a spatial region proximate said surface, said ionizing beam having an intensity sufficient to induce non-resonant photoionization of said sample, whereby species of matter in said sample will be non-selectively ionized; and
   subjecting the ionized sample to mass spectral analysis to determine the nature of said unknown species.

14. Apparatus for use in analyzing a surface including unknown species of matter comprising:
   probe beam means providing a probe beam directed at the surface under examination to cause a sample of material to be removed therefrom;
   ionizing beam means providing a non-resonant ionizing beam of radiation directed at a spatial region proximate said surface, and having an intensity sufficient to induce non-resonant photoionization of said sample in said spatial region, whereby species of matter included in said sample will be non-selectively ionized; and
   a mass spectrometer disposed with respect to said spatial region for analyzing the ionized sample.

15. The apparatus of claim 14, wherein said mass spectrometer is provided by a time-of-flight mass spectrometer.

16. The apparatus of claim 15, further including means for pulsing said probe beam, thereby reducing damage to said surface.

17. The apparatus of claim 16, further including means for pulsing said ionizing beam in time correlation with said probe beam.

18. The apparatus of claim 5 wherein said time-of-flight mass spectrometer includes means for discriminating against secondary ions from the surface under examination.

19. The apparatus of claim 18 wherein said means for discriminating comprises ion reflector means.

20. The apparatus of claim 5 wherein said time-of-flight mass spectrometer includes means for time focusing said ionized sample so as to compensate for a spread in initial velocities of ions in said sample, thereby enhancing the resolution of said analysis.

21. The apparatus of claim 20 wherein said means for time focusing comprises ion reflector means.

22. Apparatus for use in analyzing a surface of a specimen including unknown species of matter comprising:
an evacuation chamber;
mounting means disposed within said chamber for holding said specimen;
probe beam means providing a probe beam directed at a surface of said specimen to cause a sample of material to be removed therefrom;
ionizing beam means providing a non-resonant ionizing beam of radiation directed at a spatial region proximate said surface, said ionizing beam having an intensity sufficient to induce non-resonant photoionization of said sample in said spatial region, whereby species of matter included in said sample will be non-selectively ionized;
wherein said evacuation chamber includes a field-free ion drift region;
acceleration means disposed within said evacuation chamber for propelling the ionized sample across said drift region; and
detector means disposed within said chamber for detecting the ionized sample exiting from said drift region, said above-named means being operatively connected for conducting time-of-flight mass spectral analysis of the ionized sample.

23. The apparatus of claim 22, further comprising ion reflector means disposed in operative association with said ion drift region so as to reflect said ionized sample toward said detector means.

24. Apparatus for use in analyzing a surface including unknown species of matter comprising:
probe beam means providing a probe beam directed at the surface under examination to cause a sample of matreial to be removed therefrom;
ionizing beam means providing non-resonant ionizin beam of radiation directed at a spatial region proximate said surface, and having an intensity sufficient to induce non-resonant multiphoton ionization of said sample in said spatial region, whereby species of matter included in said sample will be non-selectively ionized; and
a mass spectrometer disposed with respect to said spatial region for analyzing the ionized sample.

25. The apparatus of claim 24 wherein said mass spectrometer is provided by a time-of-flight mass spectrometer.

26. The apparatus of claim 25 said time-of-flight mass spectrometer includes means for discriminating against secondary ions from the surface under examination.

27. The apparatus of claim 26 wherein said means for discriminating comprises ion reflector means.

28. The apparatus of claim 25 wherein said time-of-flight mass spectrometer includes means for time focusing sid ionized sample so as to compensate for a spread in inital velocities of ions in said sample, thereby enhancing the resolution of said analysis.

29. The apparatus of claim 28 wherein said means for time focusing comprises ion reflector means.

30. Apparatus for use in analyzing a surface of a specimen including unknown species of matter comprising:
an evacuation chamber;
mounting means disposed within said chamber for holding said specimen;
probe beam means providing a probe beam directed at a surface of said specimen to cause a sample of material to be removed therefrom;
ionizing beam means providing a non-resonant ionizing beam of radiation directed at a spatial region proximate said surface, said ionizing beam having an intensity sufficient to induce non-resonant multi-photon ionization of said sample in said spatial region, whereby species of matter included in said sample will be nonselectively ionized;
wherein said evacuation chamber includes a field-free ion drift region;
acceleration means disposed within said evacuation chamber for propelling the ionized sample across said drift region;
ion reflector means disposed in operative association with said ion drift region so as to reflect said ionized sample toward said detector means; and
detector means disposed within said chamber for detecting the ionized sample exiting from said drift region, said above-named means being operatively connected for conducting time-of-flight mass spectral analysis of the ionized sample.

31. A method of analyzing a surface including unknown species of matter comprising the steps of:
directing a probe beam at the surface to cause a sample of material to be removed therefrom;
directing a non-resonant ionizing beam of radiation at the removed sample in an ionizing region proximate the surface, said ionizing beam having an intensity sufficient to induce saturated non-resonant multi-photon ionization of said sample in said ionizing region, whereby species of matter included in said sample will be non-selectively ionized; and
subjecting the ionized sample to mass spectrometric analysis to determine the nature of said species.

32. The method of claim 31 wherein said ionized sample is subjected to time-of-flight mass spectrometric analysis and said analysis includes the step of time focusing said ionized sample so as to compensate for a spread in initial velocities of ions in said sample, thereby enhancing the resolution of said analysis.

33. The method of claim 32 further comprising the step of adjusting the intensity of said probe beam so as to remove only minute amounts of material from said surface, whereby minimal damage is done to said surface, 34. The method of claim 32 wherein said time focusing step comprises the step of electrostatically reflecting said ionized sample.

35. The method of claim 31 wherein said ionized sample is subjected to time-of-flight mass spectrometric analysis and said analysis includes the step of energetically discriminating against secondary ions from the surface, thereby reducing unwanted background.

36. The method of claim 35, further comprising the step of adjusting the intensity of said probe beam so as to remove only minute amounts of material from said surface, whereby minimal damage is done to said surface.

* * * * *